United States Patent

Nakano

Patent Number: 6,005,815
Date of Patent: Dec. 21, 1999

[54] SEMICONDUCTOR MEMORY

[75] Inventor: Sotaro Nakano, Tokyo, Japan

[73] Assignee: Oki Electric Industry Co., Ltd., Tokyo, Japan

[21] Appl. No.: 09/057,536

[22] Filed: Apr. 9, 1998

[30] Foreign Application Priority Data

Oct. 13, 1997 [JP] Japan .................................... 9-279109

[51] Int. Cl.$^6$ ...................................................... G11C 7/00
[52] U.S. Cl. ................ 365/201; 365/230.06; 365/189.08
[58] Field of Search .................... 365/201, 229, 365/191, 189.08, 230.06, 226

[56] References Cited

U.S. PATENT DOCUMENTS 5,293,340  3/1994  Fujita ........................................ 365/201
5,363,333  11/1994  Tsujimoto ................................ 365/201
5,615,164  3/1997  Kirihata et al. ..................... 365/230.06

FOREIGN PATENT DOCUMENTS 07220498  8/1995  Japan .

*Primary Examiner*—David Nelms
*Assistant Examiner*—Thong Le
*Attorney, Agent, or Firm*—Rabin & Shampagne, P.C.

[57] ABSTRACT

A semiconductor memory provided, in addition to the regular components essential for a memory, with a unit employable for more accelerated burn-in test or an insulation test applicable to a semiconductor memory to be conducted by application of a voltage higher than the normal voltage at a temperature higher than the ambient temperature, to every other one of the word lines or the bit lines or to every word lines of which the numbers are odd or even, while the potential of the other lines are kept at the ground level.

10 Claims, 6 Drawing Sheets

F I G. 2
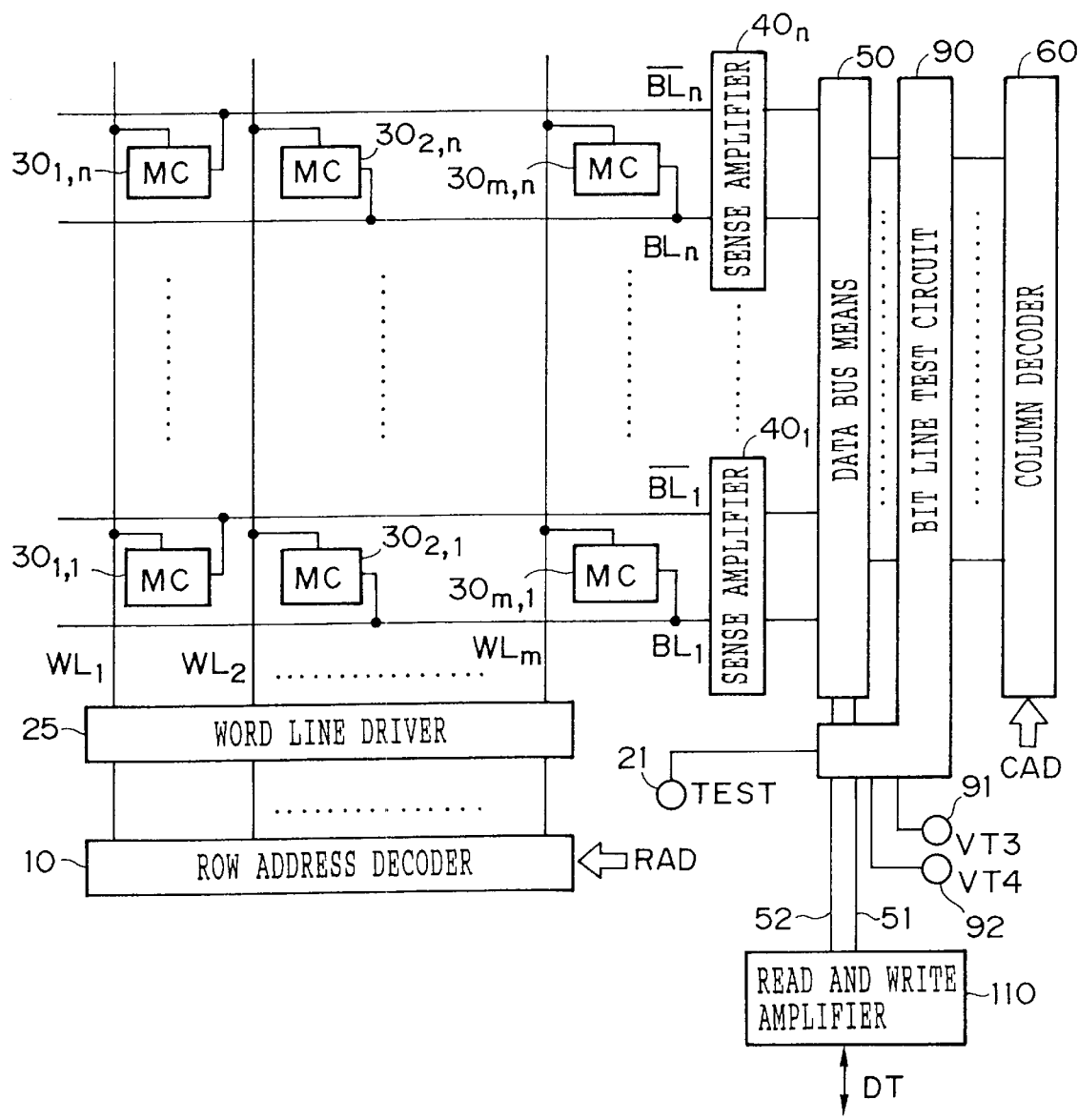

SEMICONDUCTOR MEMORY

FIELD OF THE INVENTION

This invention relates to a semiconductor memory. More specifically, this invention relates to a semiconductor memory having a built-in circuit employable for conducting a burn-in test or an acceleration test in which a semiconductor memory is applied a voltage higher than the ordinary voltage at a temperature higher than the allowable ambient temperature.

BACKGROUND OF THE INVENTION

It is well known that the failure rate for an electronic device such as a semiconductor memory is largest during a short period just after the commencement of employment thereof and decreases exponentially following the period in which it is employed thereafter. A burn-in test or an acceleration test is a test to selectively exclude electronic devices having initial faults by applying an electronic device such as a semiconductor memory with an electric voltage higher than the rated voltage of the electric device to impose the electric device to be tested with conditions severer than the ordinary conditions at which the electric devices are ordinarily employed. In other words, the burn-in test or the acceleration test is a test to cause an electronic device to endure intentionally produced virtual employment conditions equivalent to those which cause results as if the tested electronic devices are employed for a long period.

For example, an electronic device of which the rated power supply voltage is 5 V and which is employable under an ambient temperature of zero through 70° C. is applied, under a burn-in test, 7 V at an ambient temperature of 125° C. When successfully passing such a burn-in test, the electronic device is determined to be a good product employable for a guaranteed period under rated conditions.

In a burn-in test applicable to a semiconductor memory available in the prior art, each word line is selectively applied a voltage higher than the rated power supply voltage in turn and during the period, all of the bit lines are applied the same higher voltage off and on simultaneously with the application of a higher voltage to the word lines. This means that the period required for a burn-in test is equivalent to a period calculated by a formula (the period of application of voltage to all the bit lines and the period of pause) multiplied by (the quantity of the word lines). Supporting a four Mega-bit RAM being 2048 word lines and 2048 bit lines, and supposing the period of application of voltage to all the bit lines and the period of pause is one minute, an approximate period of 34 hours is required to finish a burn-in test for one four Mega-bit RAM. Since this period is long, it is required to shorten the period required for conducting a burn-in test applicable to a semiconductor memory. In this sense, development of a semiconductor memory having a built-in circuit employable for conducting a burn-in test or an acceleration test is a remarkable advantage for the industry.

OBJECTS AND SUMMARY OF THE INVENTION

The object of this invention is to provide a semiconductor memory having a built-in circuit employable for conducting a burn-in test or an acceleration test.

To achieve the foregoing object, a semiconductor memory having a built-in circuit employable for conducting a burn-in test or an acceleration test is based on a concept that a word line test circuit or a bit line test circuit having a function to apply a first voltage e.g. a voltage higher than or lower than the rated voltage to every other word line or every other bit line, apply a second voltage e.g. a zero voltage to the remaining word lines or to the remaining bit lines and apply a third voltage e.g. a zero voltage to all the bit lines or to all the word lines.

More specifically, a semiconductor memory in accordance with a first embodiment of this invention comprises:

a plurality of word lines arranged in parallel to one another, a row decoder for receiving row address signals, for decoding the row address signals and for selecting one of the word lines designated by each of the row address signals, a plurality of bit lines arranged in parallel to one another and in a direction crossing the plurality of word lines, a column decoder for receiving column address signals, for decoding the column address signals and for selecting one of the bit lines designated by each of the column address signals, a plurality of memory cells defined by a plurality of cross points of the word lines and the bit lines, and a means to write and read a position in which a capacitor constituting the memory cell is charged or discharged, in one of the memory cells selected by a combination of each of the row address signals and each of the column address signals, further comprises:

a word line test circuit for applying every other one of the word lines with a first voltage e.g. a voltage higher than or lower than the ordinary voltage and for applying the remaining ones of the word lines with a second voltage e.g. the ground potential, while all the bit lines are applied a third voltage e.g. the ground potential, the first, second and third voltage being generated by a voltage generator arranged in the semiconductor memory, excepting any of the first, second and third voltage is the ground potential.

A semiconductor memory in accordance with a second embodiment of this invention comprises:

a plurality of bit lines arranged in parallel to one another, a row decoder for receiving row address signals, for decoding the row address signals and for selecting one of the bit lines designated by each of the row address signals, a plurality of bit lines arranged in parallel to one another and in a direction crossing the plurality of word lines, a column decoder for receiving column address signals, for decoding the column address signals and for selecting one of the bit lines designated by each of the column address signals, a plurality of memory cells defined by a plurality of cross points of the word lines and the bit lines, and a means to write and read a position in which a capacitor constituting the memory cell is charged or discharged, in one of the memory cells selected by a combination of each of the row address signals and each of the column address signals, further comprises:

a bit line test circuit for applying every other one of the bit lines with a first voltage e.g. a voltage higher than or lower than the ordinary voltage and for applying the remaining ones of the bit lines with a second voltage e.g. the ground potential, while all the word lines are applied a third voltage e.g. the ground potential, the first, second and third voltage being generated by a voltage generator arranged in the semiconductor memory, excepting any of the first, second and third voltage is the ground potential.

A semiconductor memory in accordance with a third embodiment of this invention comprises:

a plurality of bit lines arranged in parallel to one another, a row decoder for receiving row address signals, for decoding the row address signals and for selecting one of the bit lines designated by each of the row address signals, a plurality of bit lines arranged in parallel to one another and in a direction crossing the plurality of word lines, a column decoder for receiving column address signals, for decoding the column address signals and for selecting one of the bit lines designated by each of the column address signals, a plurality of memory cells defined by a plurality of cross points of the word lines and the bit lines, and a means to write and read a position in which a capacitor constituting the memory cell is charged or discharged, in one of the memory cells selected by a combination of each of the row address signals and each of the column address signals, further comprises:

a word line test circuit for applying every other one of the word lines with a first voltage e.g. a voltage higher than or lower than the ordinary voltage and for applying the remaining ones of the word lines with a second voltage e.g. the ground potential, while all the bit lines are applied a third voltage e.g. the ground potential, the first, second and third voltage being applied via a terminal arranged on the word line test circuit for receiving the first, second and third voltage from outside the memory.

A semiconductor memory in accordance with a fourth embodiment of this invention comprises:

a plurality of word lines arranged in parallel to one another, a row decoder for receiving row address signals, for decoding the row address signals and for selecting one of the word lines designated by each of the row address signals, a plurality of bit lines arranged in parallel to one another and in a direction crossing the plurality of word lines, a column decoder for receiving column address signals, for decoding the column address signals and for selecting one of the bit lines designated by each of the column address signals, a plurality of memory cells defined by a plurality of cross points of the word lines and the bit lines, and a means to write and read a position in which a capacitor constituting the memory cell is charged or discharged, in one of the memory cells selected by a combination of each of the row address signals and each of the column address signals, further comprises:

a bit line test circuit for applying every other one of the bit lines with a first voltage e.g. a voltage higher than or lower than the ordinary voltage and for applying the remaining ones of the bit lines with a second voltage e.g. the ground potential, while all the word lines are applied a third voltage e.g. the ground potential, the first, second and third voltage being applied via a terminal arranged on the bit line test circuit for receiving the first, second and third voltage from outside the memory.

In any of the foregoing embodiments, the potential of the second voltage and the third voltage can be selected in a same voltage.

BRIEF DESCRIPTION OF THE DRAWINGS

This invention, together with its various features and advantages, can be readily understood from the following more detailed description presented in conjunction with the following drawings, in which:

FIG. 2 is a schematic block diagram of a semiconductor memory in accordance with the second embodiment of this invention.

DETAILED DESCRIPTION OF THE PREFERRED EMBODIMENTS

FIRST EMBODIMENT

A semiconductor memory provided with a word line test circuit for applying every other one of the word lines with a voltage higher than the ordinary voltage, the higher voltage being given from the internal circuit of the semiconductor memory cell, while keeping all the bit lines at the ground potential.

Figure 1:
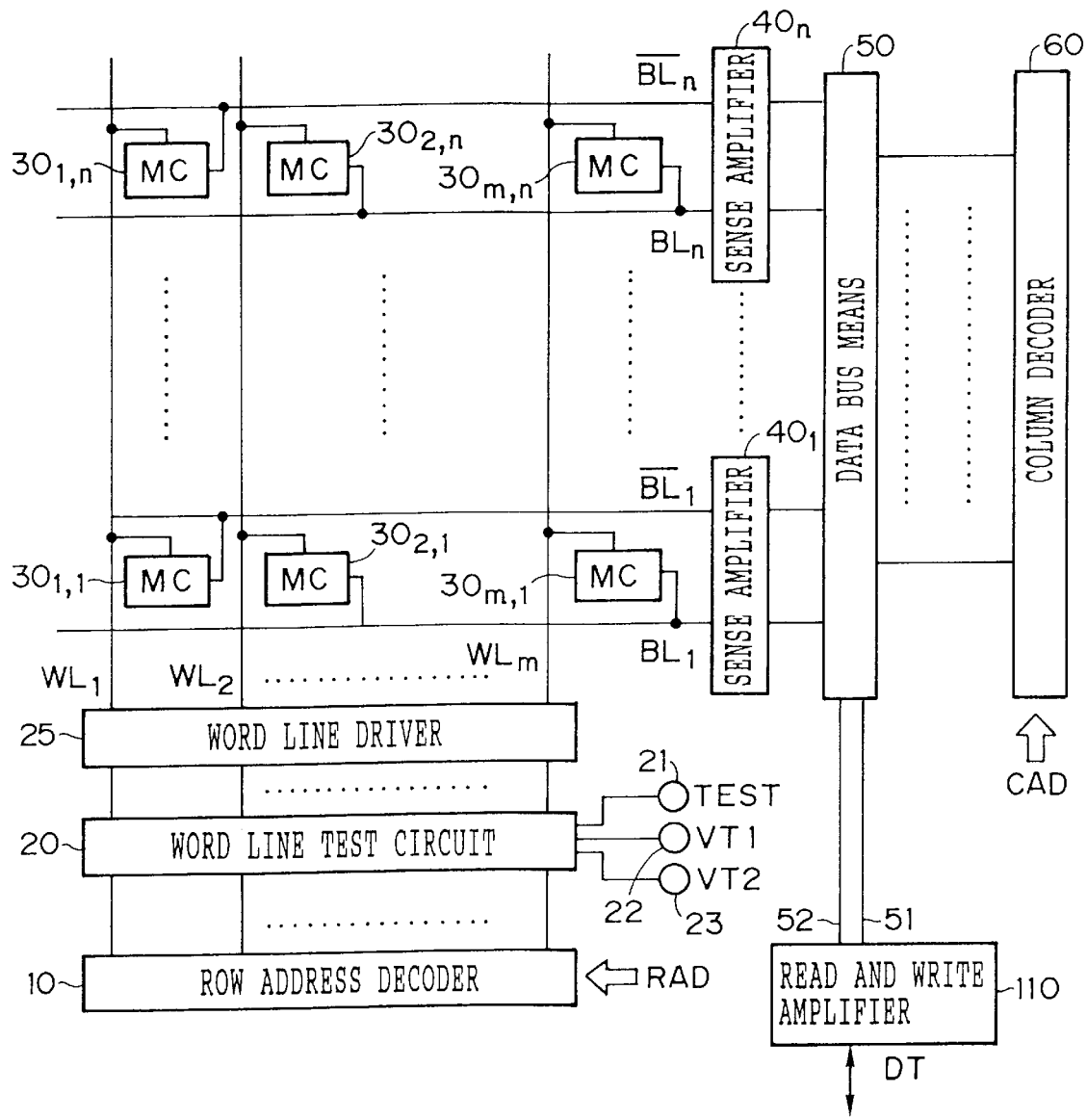
FIG. 1 is a schematic block diagram of a semiconductor memory in accordance with the first embodiment of this invention.

Referring to FIG. 1, m (e.g. 2048) word lines ($WL_1$) through ($WLm$) and n (e.g. 2048) couples of bit lines ($BL_1$) through ($BLn$) and ($\overline{BL_1}$) through ($\overline{BLn}$) are arranged to cross each other. It is noted, however, each of the bit lines ($BL_1$) through ($BLn$) and ($\overline{BL_1}$) through ($\overline{BLn}$) is connected every other word line ($WL_1$) through ($WLm$) as is illustrated in FIG. 1. Each memory cell (MC) or ($30_{11}$ through $30mn$) is formed at a cross point of a word line (WLi) and a bit line (BLi or $\overline{BLi}$). Since each bit line ($BL_1$) through ($BLn$) or ($\overline{BL_1}$) through ($BLn$) is connected to every other word line ($WL_1$) through (WLm), the quantity of the memory cells (MC) or ($30_{11}$) through ($30mn$) is 4,194,304.

It is needless to refer to the structure of each memory cell which consists of one FET of which the gate is connected to a word line, of which the source is connected to a bit line and of which the drain is connected to a terminal of one capacitor of which the other terminal is grounded, in the case of the so called one-transistor & one capacitor structure, so that each memory cell has a function to be selected by application of signals to one selected word line and to one selected bit line.

Each of the word lines ($WL_1$) through (WLm) is connected to a word line driver (25) which is connected to a word line test circuit (20) which has a TEST terminal (21) for receiving a command signal for initiating a burn-in test, a first terminal (22) for receiving a first word line test voltage ($VT_1$) and a second terminal (23) for receiving a second word line test voltage ($VT_2$). The word line test circuit (20) is further connected to a row address decoder (10) which is given a row address decoder signal (RAD). Each couple of bit lines ($BL_1$) through (BLn) and ($\overline{BL_1}$) through ($\overline{BLn}$) is connected to a sense amplifier ($40_1$) through (40n) which is connected a data bus means (50). The data bus means (50) is connected to a column address decoder (60) which receives a column address decoder signal (CAD), and a read and write amplifier (110) which reads data from each memory cell (MC) or ($30_{11}$) through (30mn) and outputs the data outward and writes data from outside into each memory cell (MC) or ($30_{11}$) through (30mn).

Each of the row address decoder signals (RAD) consists of e.g. the first 11 bits of an address signal having e.g. 22 bits. When receiving a row address decoder signal (RAD), the row address decoder (10) gives a signal to a single selected word line (WLi) designated by the row address decoder signal (RAD).

Each of the column address decoder signals (CAD) consists of e.g. the last 11 bits of an address signal having e.g. 22 bits. When receiving a column address decoder signal (CAD), the column address decoder (60) gives a signal to a single selected bit line couple (BLi or $\overline{BLi}$) designated by the column address decoder signal (CAD).

In this manner, one memory cell is selected in accordance with an address signal.

Supposing the TEST terminal (21) is applied a HIGH level command signal (TEST) to forbear a burn-in test, the semiconductor memory becomes ready to work as a memory. In other words, a combination of the read and write amplifier (110) and the data bus means (50) is employed to write a piece of binary information in the selected memory cell (MC) or (30ij) and to read another piece of binary information from the other selected memory cell (MC) or (30ij).

Supposing the test terminal (21) is applied a LOW level command signal (TEST) to initiate a burn-in test, the word line test circuit (20) connects all the word lines ($WL_1$) through (WLm) located in the odd or even numbers to the first terminal (22) to apply the first word line test voltage ($VT_1$) e.g. 7 V, and the word line test circuit (20) connects all the word lines ($WL_1$) through (WLm) located in the even or odd numbers to the second terminal (23) to apply the second word line test voltage ($VT_2$) e.g. the ground potential.

In other words, the first word line test voltage ($VT_1$) e.g. 7 V is applied all the word lines ($WL_1$) through (WLm) of which the suffix number is odd or even, and the second word line test voltage ($VT_2$) e.g. the ground potential is applied all the word lines ($WL_1$) through (WLm) of which the suffix number is even or odd.

In this manner, a voltage higher than the ordinary voltage is applied to every other word line.

During the period in which a burn-in test is conducted, all the bit lines are kept at the ground potential, which is applied through a terminal (not shown) arranged to the data bus means (50).

Figure 5:
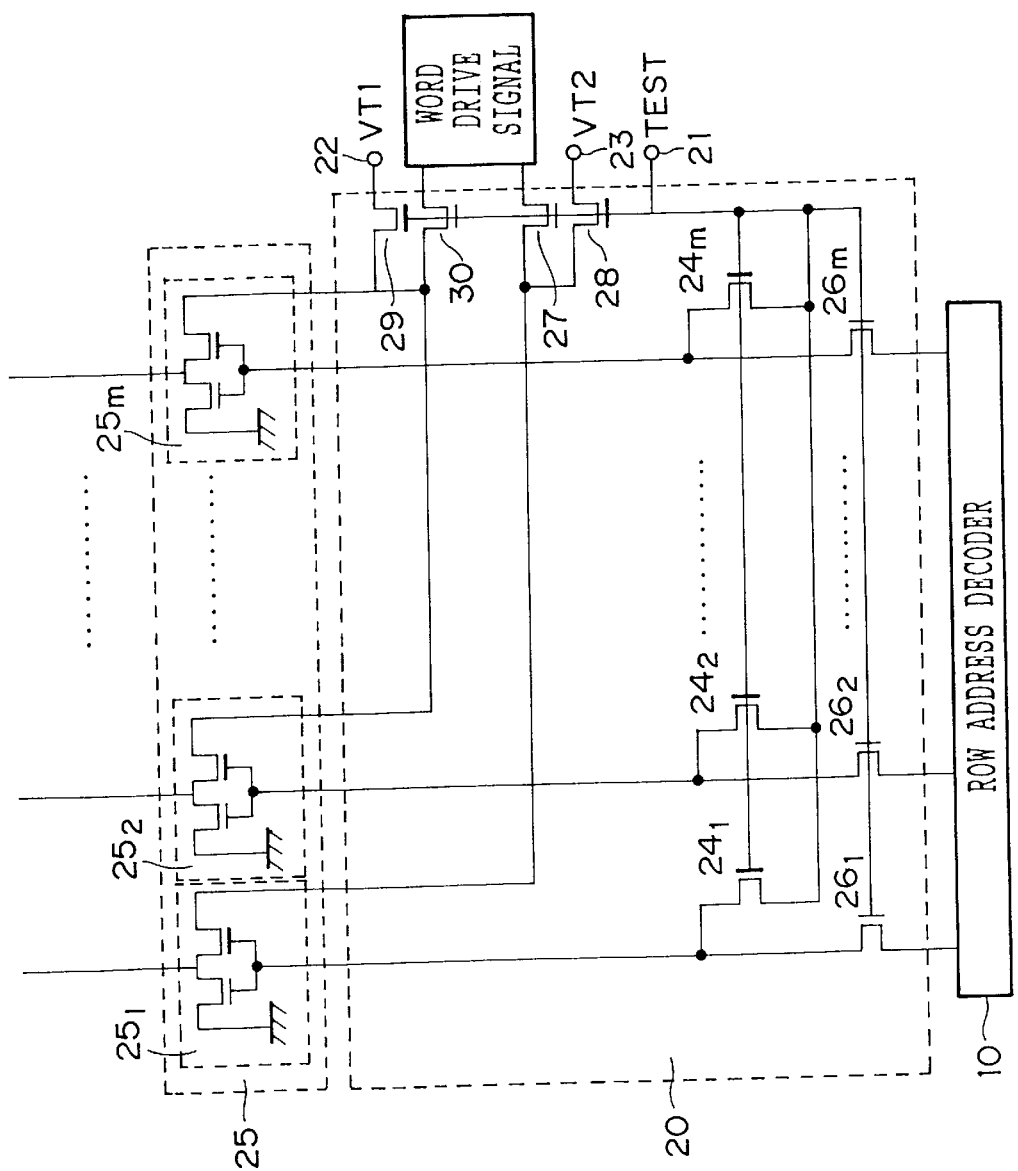
FIG. 5 is a schematic circuit diagram of a part of a word line driver and a word line test circuit of a semiconductor memory in accordance with the first or third embodiment of this invention.

Referring to FIG. 5, the internal circuit of a part of the word line driver (25) and the word line test circuit (20) illustrated in FIG. 1 will be described below.

The foregoing word line test circuit (20) has m units of p channel normally-on FETs (hereinafter referred to as a P-MOS FET) ($24_1$) through (24m) and m units of n channel normally off FETs (hereinafter referred to as an N-MOS FET, ($26_1$) through (26m). The drain of each N-MOS FET (26i) is connected to each output line of the row address decoder (10). The gate of each N-MOS FET (26i) and the gate and the drain of each P-MOS FET (24i) are connected to a terminal (21). The source of each P-MOS FET (24i) and the source of each N-MOS FET (26i) are connected the gate of each of word line driver circuits (25i) of the word line driver (25).

The drains of the P-MOS FETs of the word line driver circuit (25i) having the odd numbers are connected to the sources of an N-MOS FET (27) and a P-MOS FET (28). The drains of the P-MOS FETs of the word line driver circuit (25i) having the even numbers are connected the sources of a P-MOS FET (29) and an N-MOS FET (30). The gates of the N-MOS FETs (27) and (30) are connected the TEST terminal (21). The drains of the N-MOS FETs (27) and (30) are connected "a word driving signal". The gates of the P-MOS FETs (28) and (29) are connected to the TEST terminal (21). The drains of the P-MOS FETs (28) and (29) are connected respectively to the $VT_1$ terminal (22) and the $VT_2$ terminal (23).

Procedure of a burn-in test will be described below.

Firstly, a semiconductor memory is placed in a constant temperature oven et al. to keep the temperature of the semiconductor memory at a temperature higher than the highest of the allowable ambient temperature e.g. 125° C.

Secondly, a LOW level potential is set on the TEST terminal (21) of the word line test circuit. A voltage higher than the ordinary voltage e.g. 7 V is applied to the $VT_1$ terminal (22) of the word line test circuit. The ground potential is applied to the $VT_2$ terminal (23) of the word line test circuit.

Thirdly, the ground potential is applied to all the bit lines by applying the ground potential to a terminal (not shown) arranged to the data bus means (50).

Fourthly, the foregoing voltage position is kept for one minute, until a burn-in test is finished.

Thereafter, the potential applied to the TEST terminal (21) is shifted to a HIGH level to shift to the normal conditions. An operation test is conducted under the normal temperature and the normal power supply voltage, supposing a predetermined information pattern to be written into the semiconductor memory and read it out of the semiconductor memory.

Provided no faults are found, the semiconductor memory is determined normal and acceptable.

SECOND EMBODIMENT

A semiconductor memory provided with a bit line test circuit for applying every other one of the bit lines with a voltage higher than the ordinary voltage, the higher voltage being given from the internal circuit of the semiconductor memory cell, while keeping all the word lines at the ground potential.

Referring to FIG. 2, the difference from FIG. 1 is as follows.

1. The word line test circuit (20) is removed.
2. A bit line test circuit (90) is introduced.

Therefore, a description will be given below for the bit line test circuit (90).

The bit line test circuit (90) which intervenes between the column decoder (60) and the data bus means (50) has a TEST terminal (21) for receiving a command signal for initiating a burn-in test, a third terminal (91) for receiving a first bit line test voltage ($VT_3$) and a fourth terminal (92) for receiving a second bit line test voltage ($VT_4$).

Similarly to the first embodiment, every other one of the bit lines are applied a voltage higher than the normal voltage e.g. 7 V, while the remaining bit lines and all the word lines are kept at the ground potential, under a burn-in test.

Figure 6:
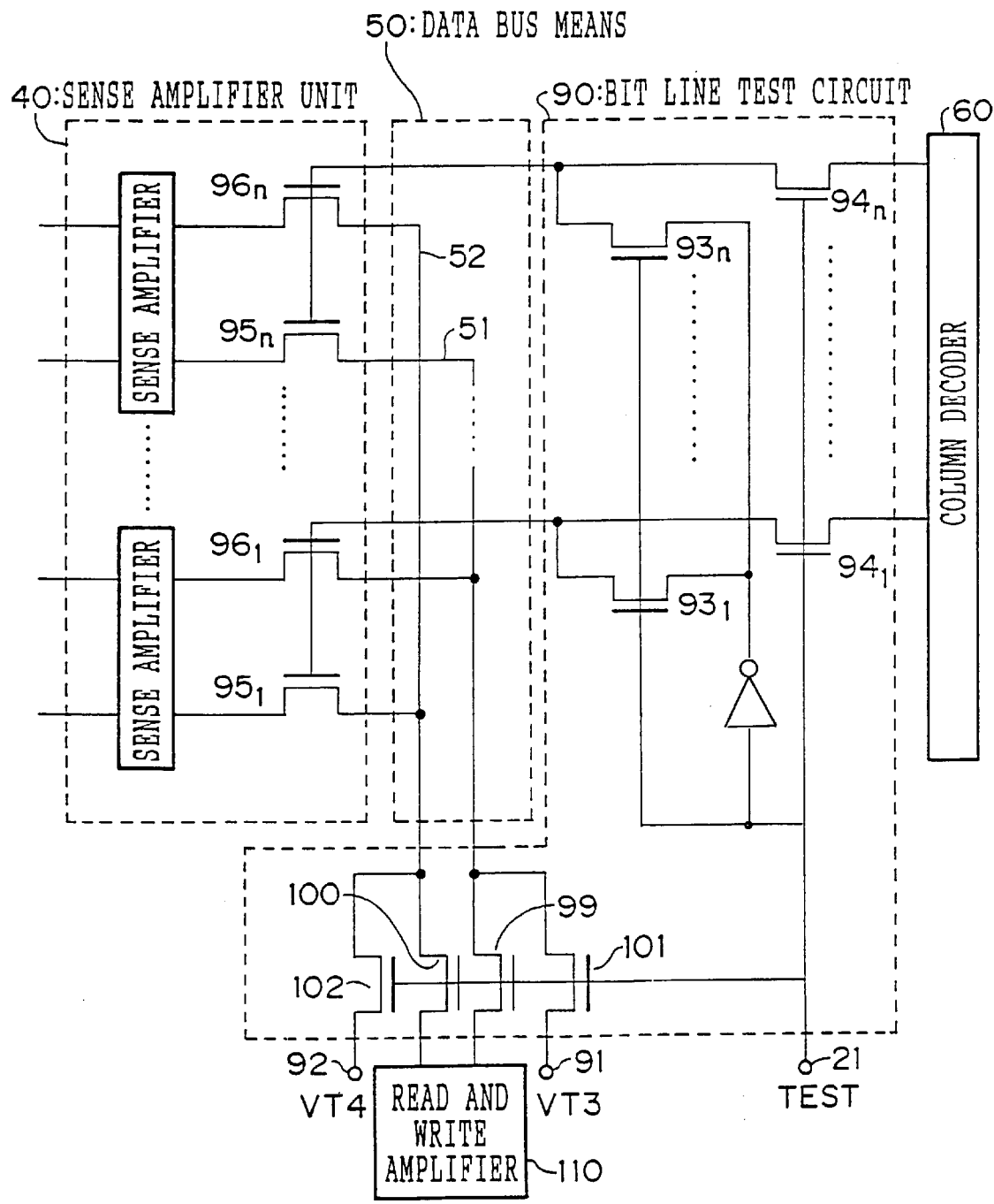
FIG. 6 is a schematic block diagram of a part of a sense amplifier unit, a part of the data bus means and a part of the bit line test circuit.

Referring to FIG. 6, the internal circuit of part of the sense amplifier unit (40), the data bus means (50) and the bit line test circuit (90) will be described below.

The foregoing combination of the sense amplifier unit (40), the data bus means (50) and the bit line test circuit (90) has a function to discontinue the column decoder (60), to apply every other bit line a voltage higher than the normal voltage e.g. 7 V through the $VT_3$ terminal (91) and to apply all the remaining bit lines the ground potential through the $VT_4$ terminal (92), during a period in which a burn-in test is conducted. In this period, all the word lines are kept at the ground potential.

THIRD EMBODIMENT

A semiconductor memory provided with a word line test circuit for applying every other one of the word lines with a voltage higher than the ordinary voltage, the higher voltage being given from outside the semiconductor memory, while keeping all the bit lines at the ground potential.

Figure 3:
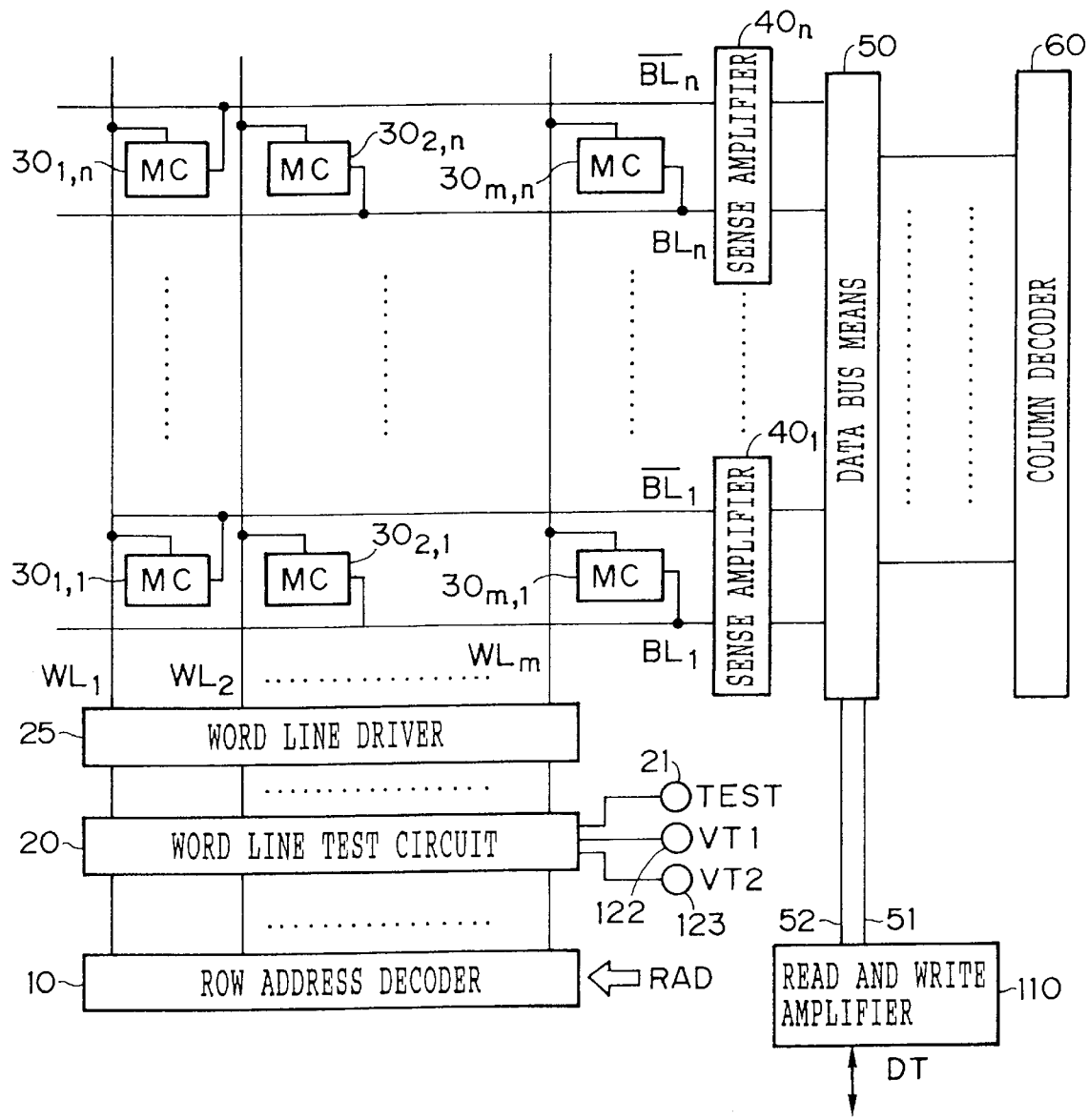
FIG. 3 is a schematic block diagram of a semiconductor memory in accordance with the third embodiment of this invention.

Referring to FIG. 3, the difference from the first embodiment illustrated in FIG. 1 is that the third embodiment has terminals (122) and (123) respectively replacing the terminals (22) and (23) of the first embodiment. Terminals 191 and 192 receive the voltage from a source external to the semiconductor memory.

This embodiment has the following advantages: selection of the $VT_1$ voltage is entirely free, of the semiconductor memory and there is no possibility in which the higher voltage is applied to the components to which no burn-in test is scheduled.

FOURTH EMBODIMENT

A semiconductor memory provided with a bit line test circuit for applying every other one of the bit lines with a voltage higher than the ordinary voltage, the higher voltage being given from outside the semiconductor memory, while keeping all the word lines at the ground potential.

Figure 4:
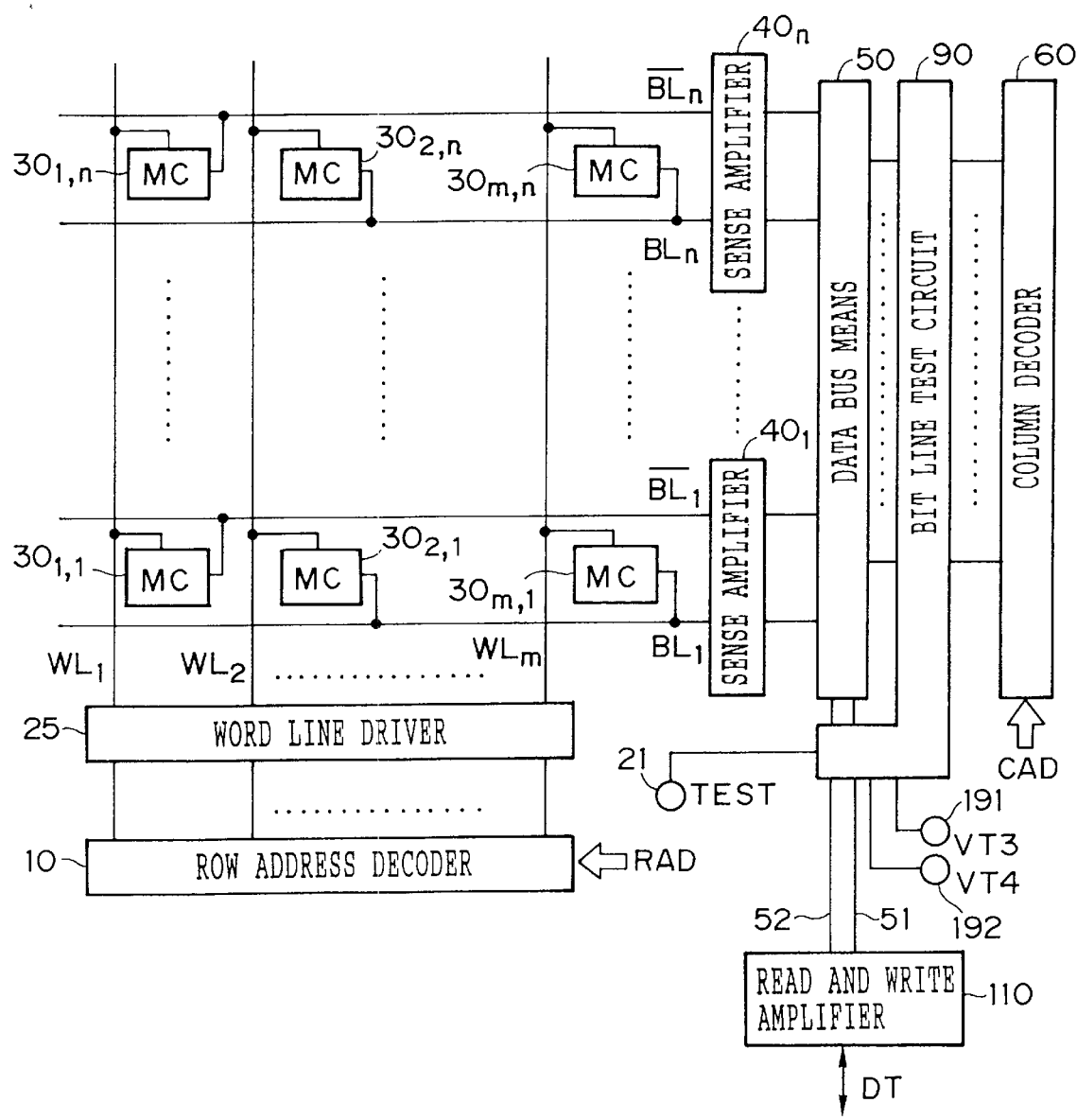
FIG. 4 is a schematic block diagram of a semiconductor memory in accordance with the fourth embodiment of this invention.

Referring to FIG. 4, the difference from the second embodiment illustrated in FIG. 2 is that the fourth embodiment has terminals (191) and (192) respectively replacing the terminals (91) and (92) of the second embodiment. Terminals 191 and 192 receive the voltage from a source external to the semiconductor memory.

This embodiment has the same advantages as those of the third embodiment with respect to the second embodiment.

The foregoing description has clarified that a semiconductor memory which is provided, in addition to the regular components essential for a memory, with a unit employable for a more accelerated burn-in test or an insulation test applicable to a semiconductor memory to be conducted by application of a voltage higher than the normal voltage at a temperature higher than the normal ambient temperature, to every other one of the word lines or the bit lines, which the potential of the remaining lines are kept at the ground level, has been successfully provided by this invention.

It may be possible to combine the idea of the first embodiment and the idea of the second embodiment for the purpose to further shorten the time required for a burn-in test.

Although this invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A semiconductor memory comprising:
   a plurality of word lines arranged in parallel to one another;
   a row decoder for receiving and decoding a row address signal and for selecting one of said word lines, wherein the selected one of said word lines corresponds to the decoded row address signal;
   a plurality of bit lines arranged in parallel to one another, disposed in a direction perpendicular to said plurality of word lines, and intersecting said plurality of word lines at a plurality of intersecting points;
   a column decoder for receiving and decoding a column address signal and for selecting one pair of bit lines from among said plurality of bit lines, wherein the selected one pair of bit lines corresponds to the decoded column address signal;
   a plurality of memory cells, one memory cell formed at each of the plurality of intersection points; and
   a word line test circuit for simultaneously applying one of either a first voltage or a second voltage to every one of said word lines, wherein application of the first voltage and the second voltage are fixed to alternate on successive word lines so that each two adjacent word lines has the first voltage applied to one of the two adjacent word lines and the second voltage applied to the other of the two adjacent word lines.

2. A semiconductor memory in accordance with claim 1, wherein said first voltage and said second voltage are generated internal to the semiconductor memory.

3. A semiconductor memory in accordance with claim 1, wherein said word line test circuit includes terminals for connection to a voltage source external to the semiconductor memory, for receiving said first voltage and said second voltage.

4. A semiconductor memory in accordance with claim 1, wherein the word line test circuit also applies a third voltage to all the bit lines simultaneously to applying the first voltage and the second voltage to said word lines.

5. A semiconductor memory in accordance with claim 4, wherein a potential of said second voltage and a potential of said third voltage are identical to each other.

6. A semiconductor memory comprising:
   a plurality of word lines arranged in parallel to one another;
   a row decoder for receiving and decoding a row address signal and for selecting one of said word lines, wherein the selected one of said word lines corresponds to the decoded row address signal;
   a plurality of bit lines arranged in parallel to one another, disposed in a direction perpendicular to said plurality of word lines, and intersecting said plurality of word lines at a plurality of intersection points;
   a column decoder for receiving and decoding a column address signal and for selecting one pair of bit lines from among said plurality of bit lines, wherein the selected one pair of bit lines corresponds to the decoded column address signal;
   a plurality of memory cells, one memory cell formed at each of the plurality of intersection points; and a bit line test circuit for simultaneously applying one of either a first voltage or a second voltage to every one of said bit lines, wherein application of the first voltage and the second voltage are fixed to alternate on successive bit lines so that each two adjacent bit lines has the first voltage applied to one of the two adjacent bit lines and the second voltage applied to the other of the two adjacent bit lines.

7. A semiconductor memory in accordance with claim 6, wherein said first voltage and said second voltage are generated internal to the semiconductor memory.

8. A semiconductor memory in accordance with claim 6, wherein said bit line test circuit includes terminals for connection to a voltage source external to the semiconductor memory, for receiving said first voltage and said second voltage.

9. A semiconductor memory in accordance with claim 6, wherein the bit line test circuit also applies a third voltage to all the word lines simultaneously to applying the first voltage and the second voltage to said bit lines.

10. A semiconductor memory in accordance with claim 9, wherein a potential of said second voltage and a potential of said third voltage are identical to each other.

* * * * *